US006254737B1

(12) United States Patent
Edelstein et al.

(10) Patent No.: US 6,254,737 B1
(45) Date of Patent: *Jul. 3, 2001

(54) ACTIVE SHIELD FOR GENERATING A PLASMA FOR SPUTTERING

(75) Inventors: Sergio Edelstein, Los Gatos; Mani Subramani, San Jose, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/730,722

(22) Filed: Oct. 8, 1996

(51) Int. Cl.$^7$ .................................................. C23C 14/34
(52) U.S. Cl. ........................ 204/192.12; 204/192.1; 204/290.06; 204/298.11; 204/298.31; 204/298.34; 156/345; 118/723 I; 118/723 IR
(58) Field of Search ........................... 204/192.1, 192.12, 204/295.06, 298.08, 298.11, 298.31, 298.34, 298.16, 298.37; 156/345; 118/723 I, 723 IR, 723 E (56) References Cited

U.S. PATENT DOCUMENTS

| | | | |
|---|---|---|---|
| 3,619,402 | 11/1971 | Wurm | 204/298.12 |
| 3,763,031 | * 10/1973 | Scow et al. | 204/298.08 |
| 4,336,118 | 6/1982 | Patten et al. | 204/192.12 |
| 4,362,632 | 12/1982 | Jacob | 422/186.04 |
| 4,568,845 | 2/1986 | Uehara | 310/13 |
| 4,626,312 | 12/1986 | Tracy | 156/345 |
| 4,661,228 | 4/1987 | Mintz | 204/192.25 |

(List continued on next page.)

FOREIGN PATENT DOCUMENTS

| | | |
|---|---|---|
| 1905058 | 8/1970 | (DE) . |
| 0520519 | 12/1992 | (EP) . |
| 0607797 | 1/1994 | (EP) . |
| 0593924 | 4/1994 | (EP) . |
| 0774886 | 5/1997 | (EP) . |
| 2162365 | 1/1986 | (GB) . |
| 2231197 | 11/1990 | (GB) . |
| 56-7562 | 4/1981 | (JP) . |
| 59-190363 | 10/1984 | (JP) . |
| 61190070 | 8/1986 | (JP) . |
| 6232055 | 8/1994 | (JP) . |
| 6283470 | 10/1994 | (JP) . |
| 7176398 | 7/1995 | (JP) . |
| 7176399 | 7/1995 | (JP) . |
| 8153712 | 6/1996 | (JP) . |
| 8288259 | 11/1996 | (JP) . |
| WO80/01363 | 7/1980 | (WO) . |
| WO80/02353 | 10/1980 | (WO) . |
| WO86/0623 | 11/1986 | (WO) . |
| WO92/07969 | 5/1992 | (WO) . |

(List continued on next page.)

OTHER PUBLICATIONS

Rossnagel et al. "Metal ion deposition from ionized mangetron sputtering discharge", J. Vac. Technol. B 12(1), pp. 449–453, Feb. 1994.*

(List continued on next page.)

Primary Examiner—Rodney McDonald
(74) Attorney, Agent, or Firm—Konrad, Raynes & Victor LLP (57) ABSTRACT

A combination coil and shield for a plasma chamber in a semiconductor fabrication system is provided. The coil-shield has a plurality of turns to couple energy efficiently into a plasma and also substantially blocks deposition material from reaching a second shield positioned behind the first shield.

35 Claims, 4 Drawing Sheets

U.S. PATENT DOCUMENTS

| | | | |
|---|---|---|---|
| 4,716,491 | 12/1987 | Ohno et al. | 361/230 |
| 4,792,732 | 12/1988 | O'Loughlin | 315/334 |
| 4,842,703 | 6/1989 | Class et al. | 204/192.12 |
| 4,844,775 | 7/1989 | Keeble | 216/68 |
| 4,865,712 | 9/1989 | Mintz | 204/298.16 |
| 4,871,421 | 10/1989 | Ogle et al. | 438/710 |
| 4,918,031 | 4/1990 | Flamm et al. | 438/695 |
| 4,925,542 | 5/1990 | Kidd | 427/531 |
| 4,941,915 | 7/1990 | Matsuoka et al. | 204/298.12 |
| 4,948,458 | 8/1990 | Ogle | 438/729 |
| 4,990,229 | 2/1991 | Campbell et al. | 204/298.06 |
| 4,999,096 | 3/1991 | Nihei et al. | 204/192.3 |
| 5,065,698 | 11/1991 | Koike | 118/719 |
| 5,091,049 | 2/1992 | Campbell et al. | 216/37 |
| 5,122,251 | 6/1992 | Campbell et al. | 204/298.06 |
| 5,135,629 | 8/1992 | Sawada et al. | 204/192.12 |
| 5,146,137 | 9/1992 | Gesche et al. | 315/111.21 |
| 5,175,608 | 12/1992 | Nihei et al. | 257/751 |
| 5,178,739 | 1/1993 | Barnes et al. | 204/192.12 |
| 5,206,516 | 4/1993 | Keller et al. | 250/492.2 |
| 5,225,740 | 7/1993 | Ohkawa | 315/111.41 |
| 5,231,334 | 7/1993 | Paranjpe | 315/111.21 |
| 5,234,529 | 8/1993 | Johnson | 156/345 |
| 5,234,560 | 8/1993 | Kadlec et al. | 204/192.12 |
| 5,241,245 | 8/1993 | Barnes et al. | 315/111.41 |
| 5,280,154 | 1/1994 | Cuomo et al. | 219/121.52 |
| 5,304,279 | 4/1994 | Coultas et al. | 156/345 |
| 5,312,717 | 5/1994 | Sachdev et al. | 430/313 |
| 5,346,578 | 9/1994 | Benzing et al. | 156/345 |
| 5,361,016 | 11/1994 | Ohkawa et al. | 315/111.41 |
| 5,366,585 | 11/1994 | Robertson et al. | 216/67 |
| 5,366,590 | 11/1994 | Kadomura | 738/723 |
| 5,368,685 | 11/1994 | Kumihashi et al. | 216/70 |
| 5,397,962 | 3/1995 | Moslehi | 315/111.51 |
| 5,401,350 | 3/1995 | Patrick et al. | 156/345 |
| 5,404,079 | 4/1995 | Ohkuni et al. | 315/111.81 |
| 5,417,834 | 5/1995 | Latz | 204/298.11 |
| 5,418,431 | 5/1995 | Williamson et al. | 315/111.51 |
| 5,421,891 | 6/1995 | Campbell et al. | 118/723 R |
| 5,429,070 | 7/1995 | Campbell et al. | 118/723 R |
| 5,429,710 | 7/1995 | Akiba et al. | 438/714 |
| 5,429,995 | 7/1995 | Nishiyama et al. | 348/788 |
| 5,430,355 | 7/1995 | Paranjpe | 315/111.21 |
| 5,431,799 | * 7/1995 | Mosely et al. | 204/298.06 |
| 5,503,676 | 4/1996 | Shufflebotham et al. | 118/723 MR |
| 5,540,824 | 7/1996 | Yin et al. | 204/298.34 |
| 5,560,776 | 10/1996 | Sugai et al. | 118/723 AN |
| 5,569,363 | 10/1996 | Bayer et al. | 204/192.32 |
| 5,573,595 | 11/1996 | Dible | 118/723 MP |
| 5,690,795 | * 11/1997 | Rosenstein et al. | 118/721 |
| 5,763,851 | 6/1998 | Forster et al. | 219/121.43 |
| 5,800,688 | 9/1998 | Lantsman et al. | 204/298.11 |

OTHER PUBLICATIONS

SG search report in application 9703627–1 mailed Oct. 30, 1999 (Atty. Docket 4784SG).

U.S. Serial No. 08/857,720 (Atty. Dkt. No. 1800).

U.S. Serial No. 08/857,921 (Atty. Dkt. No. 1737).

U.S. Serial No. 08/857,944 (Atty. Dkt. 1871).

U.S. Serial No. 08/907,382 (Atty. Dkt. 1957).

U.S. Serial No. 08/908,341 (Atty. Dkt. 1873).

U.S. Serial No. 08/908,342 (Atty. Dkt. 1620).

U.S. Serial No. 08/931,170 (Atty. Dkt. 1812).

U.S. Serial No. 08/971,867 (Atty. Dkt. 1957.P1).

U.S. Serial No. 09/039,695 (Atty. Dkt. 1727).

U.S. Serial No. 09/049,839 (Atty. Dkt. 938.D1).

U.S. patent application serial No. 08/853,024, filed May 8, 1997 (Atty. Dk. 1186.P1/PVD/DV).

U.S. patent application serial No. 08/851,946, filed May 6, 1997 (Atty. Dk. 1390.C1/PVD/DV).

U.S. patent application serial No. 08/857,719, filed May 16, 1997 (Atty. Dk. 1752/PVD/DV).

U.S. patent application serial No. 08/856,423, filed May 17, 1997 (Atty. Dk. 1621/PvD/DV).

U.S. patent application serial No. 08/559,345, filed Nov. 15, 1995 (Aty. Dk. 938/PVD/DV).

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett*.vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W, Kim et al., "Ionized Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Sphys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP* (Tokyo), pp. 253–260, 1995.

U.S. patent application serial No. 08/677,588, filed Jul. 9, 1996 (Atty. Dk. 1402/PVD/DV).

U.S. patent application serial No. 08/680,335, filed Jul. 10, 1996 (Aty. Dk. 1390CIP/PVD/DV).

U.S. patent application serial No. 07/954,860, filed Sep. 30, 1982 (Atty. Dk. 364).

U.S. patent application serial No. 08/461575, filed Sep. 30, 1992 (Atty. Dk 364.F1).

U.S. patent application serial No. 08/310,617, filed Sep. 30,1992 (Atty. Dk. 364.P1).

U.S. patent application serial No. 08/567,601, filed Jun. 2, 1995 (Atty. Dk. 364.P2).

U.S. patent application serial No. 08/647,182, filed May 9, 1996 (Atty. Dk. 1186/PVD/DV).

M. Matsuoka et al., Dense Plasma Production and Film Deposition by New High–Rate Sputtering Using an Electric Mirror, *J. Vac. Sci. Technol.*, A7 (4), 2652–2657, Jul./Aug. 1989.

U.S. patent application serial No. 08/733,620, filed Oct. 17, 1996 (Aty. Dk. 1457/PVD/DV).

U.S. patent application serial No. 08/677,588, filed Jul. 9, 1996 (Aty. Dk. 1402/PVD/DV).

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

U.S. patent application serial No. 08/733,620, filed Oct. 17, 1996 (Attorney Docket #1457/PVD/DV).

U.S. patent application serial No. 08/741,708, filed Oct. 31, 1996 (Attorney Docket #1590/PVD/DV).

U.S. patent application serial No. 08/680,335, filed Jul. 10,1996 (Aty. Dk. 1390–CIP/PVD/DV).

U.S. patent application serial No. 08/647,184, filed May 9, 1996 (Aty. Dk. 1383/PVD/DV).

U.S. patent application serial No. 08/846,423, filed 51497 (Aty. Dk. 1621/PVD/DV).

U.S. patent application serial No. 08/559,345, filed Nov. 15, 1995 (Aty. Dk. 938).

European Search Report, App. No. 97303124.8, dated Aug. 22, 1997.

Search Report in EPO 97307864.5 dated Jul. 31, 1998.

* cited by examiner

ACTIVE SHIELD FOR GENERATING A PLASMA FOR SPUTTERING

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Low pressure radio frequency (RF) generated plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent to the target impact the surface of the target to dislodge, i.e., "sputter" material from the target. The sputtered materials are then transported and deposited on the surface of the semiconductor wafer.

Sputtered material has a tendency to travel in straight line paths from the target to the substrate being deposited, at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be redirected into substantially vertical paths between the target and the substrate by negatively charging the substrate to position vertically oriented electric fields adjacent the substrate if the sputtered material is sufficiently ionized by the plasma. However, material sputtered in a low density plasma often has an ionization degree of less than 1% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

In a number of deposition chambers such as a physical vapor deposition chamber, the chamber walls are often formed of a conductive metal such as stainless steel. Because of the conductivity of the chamber walls, it is often necessary to place the antenna coils or electrodes within the chamber itself because the conducting chamber walls would block or substantially attenuate the electromagnetic energy radiating from the antenna. As a result, the coil and its supporting structures are directly exposed to the deposition flux and energetic plasma particles. This is a potential source of contamination of the film deposited on the wafer, and is undesirable.

To protect the coils, shields made from nonconducting materials, such as ceramics, can be placed in front of the coil. However, many deposition processes involve deposition of conductive materials such as aluminum on the electronic device being fabricated. Because the conductive material will coat the ceramic shield, it will soon become conducting, thus again substantially attenuating penetration of electromagnetic radiation into the plasma.

SUMMARY OF THE PREFERRED EMBODIMENTS

It is an object of the present invention to provide an improved method and apparatus for generating plasmas within a chamber, obviating, for practical purposes, the above-mentioned limitations.

These and other objects and advantages are achieved by, in accordance with one aspect of the invention, a plasma generating apparatus which comprises a conductive shield which forms a multi-turn coil. The conductive coil-shield is coupled to an RF source such that the coil-shield inductively couples electromagnetic energy to a plasma. Such an arrangement is believed to avoid attenuation of the RF power while at the same time substantially reducing the generation of contaminating particles from the coil-shield. Furthermore, because the coil-shield has a plurality of turns, the current required to radiate the RF power is reduced as compared to that required of single turn coils.

DETAILED DESCRIPTION OF THE DRAWINGS

Figure 1:
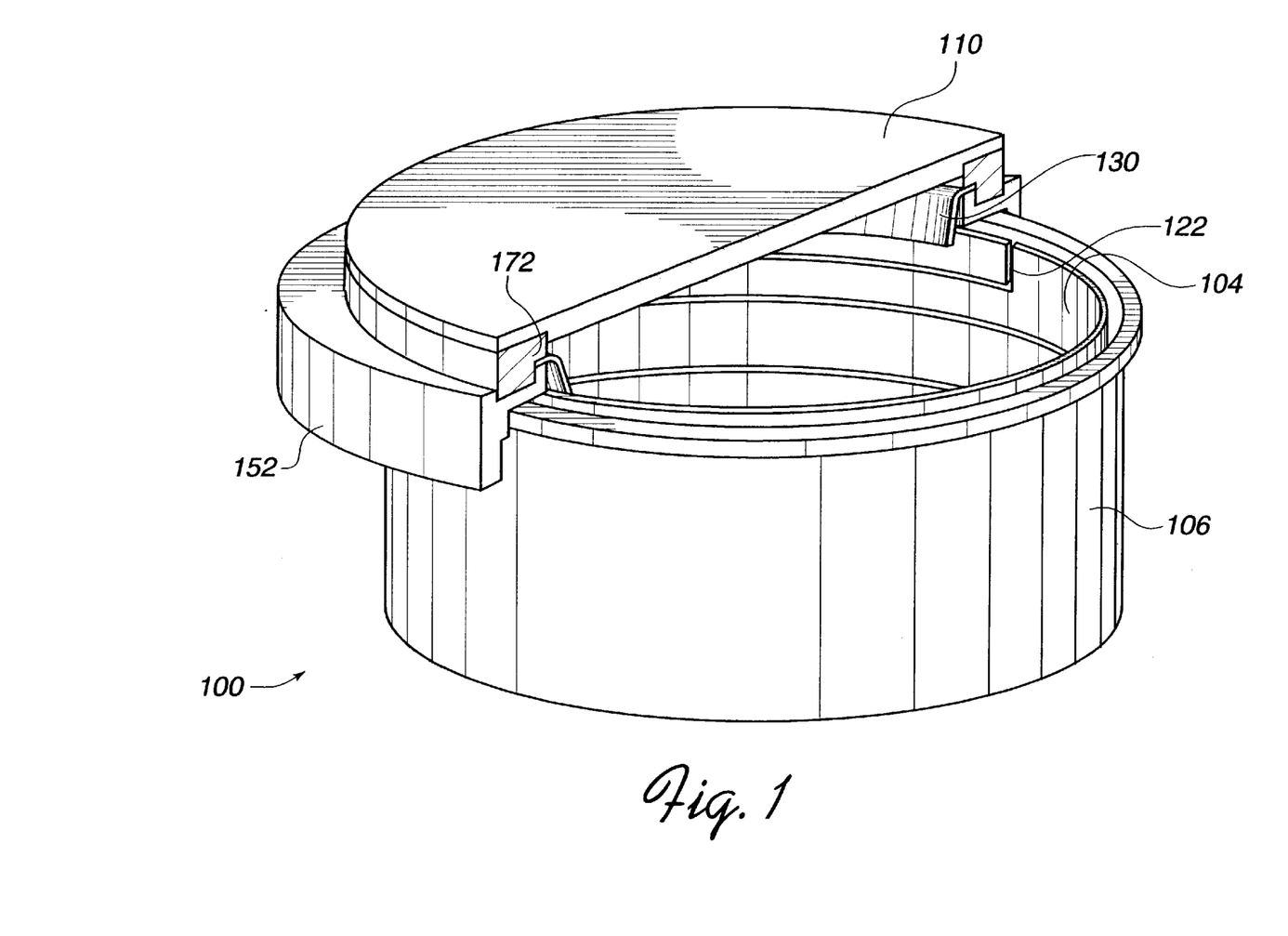
FIG. 1 is a perspective, partial cross-sectional view of a plasma generating chamber in accordance with one embodiment of the present invention.
Figure 2:
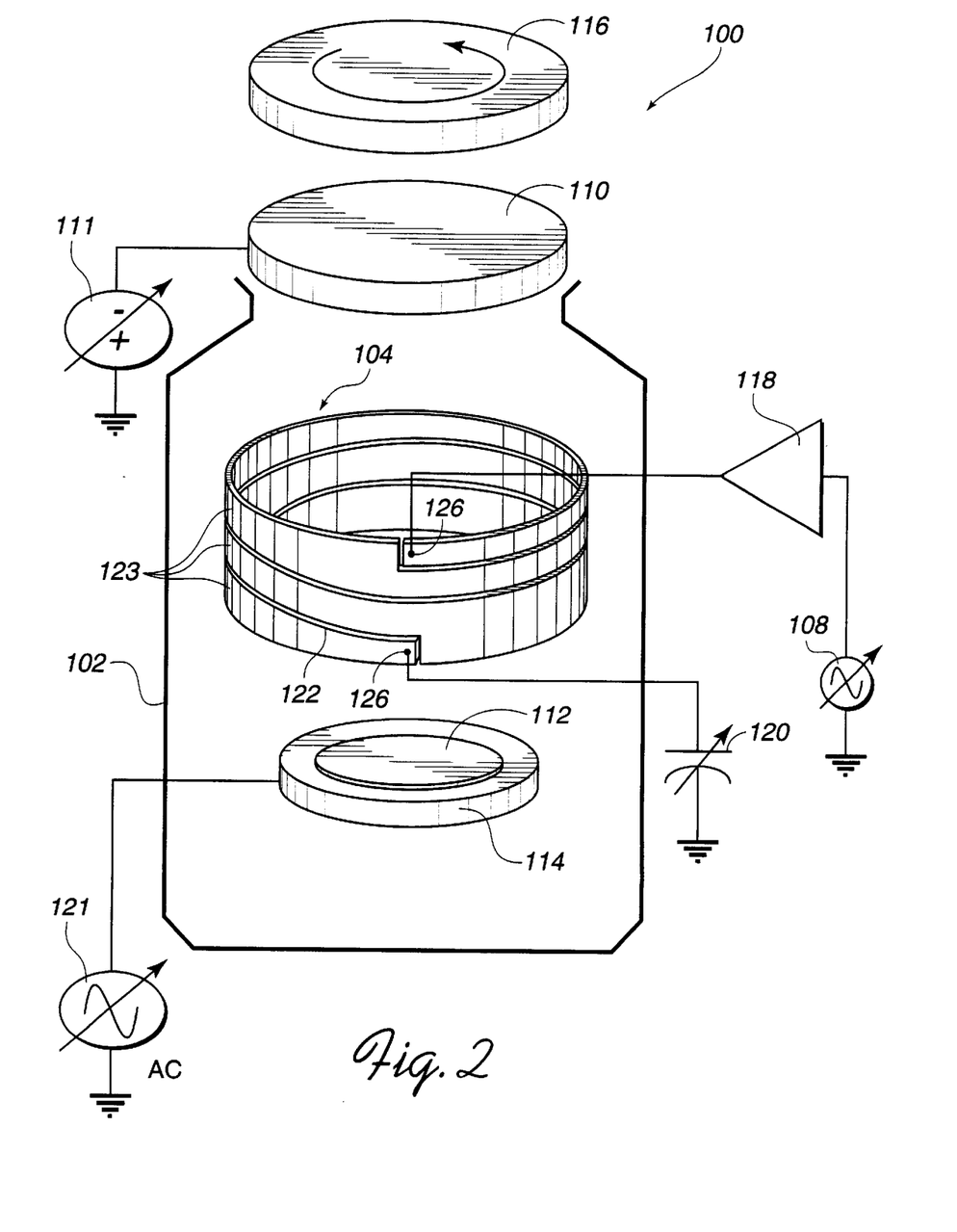
FIG. 2 is a schematic diagram of the electrical interconnections to the plasma generating chamber of FIG. 1.

Referring first to FIGS. 1 and 2, a plasma generator in accordance with an embodiment of the present invention comprises a substantially cylindrical plasma chamber 100 which is received in a vacuum chamber 102 (shown schematically in FIG. 2). The plasma chamber 100 of this embodiment has an inner shield 104 which is formed into a multi-turn coil and is insulatively carried internally by an outer shield 106. The shields 104 and 106 protect the interior walls 107 (FIG. 3) of the vacuum chamber 102 from the material being deposited within the interior of the plasma chamber 100.

Radio frequency (RF) energy from an RF generator 108 is radiated from the coil-shield 104 into the interior of the deposition system 100, which energizes a plasma within the deposition system 100. An ion flux strikes a negatively biased target 110 positioned at the top of the chamber 102. The target 110 is negatively biased by a DC power source 111. The ions eject material from the target 110 onto a substrate 112 which may be a wafer or other workpiece which is supported by a pedestal 114 at the bottom of the deposition system 100. A rotating magnetron magnet assembly 116 provided above the target 110 produces magnetic fields which sweep over the face of the target 110 to promote uniform erosion of the target.

The atoms of material ejected from the target 110 are in turn ionized by the plasma being energized by the coil-shield 104 which is inductively coupled to the plasma. The RF generator 108 is preferably coupled to the coil-shield 104 through an amplifier and impedance matching network 118. The other end of the coil-shield 104 is coupled to ground, preferably through a capacitor 120 which may be a variable capacitor. The ionized deposition material is attracted to the substrate 112 and forms a deposition layer thereon. The pedestal 114 may be negatively biased by an AC (or DC or RF) source 121 so as to externally bias the substrate 112. As set forth in greater detail in copending application Ser. No. 08/677,588, filed Jul. 9, 1996 entitled "Method for Providing Full-Face High Density Plasma Deposition" by Ken Ngan, Simon Hui and Gongda Yao, which is assigned to the assignee of the present application and is incorporated herein by reference in its entirety, external biasing of the substrate 112 may optionally be eliminated.

The coil-shield 104, like the coil-shield described in copending application Ser. No. 08/559,345, filed Nov. 15, 1995 pending, entitled "Method and Apparatus for Generating a Plasma" by Ivo Raaijmakers, Bradley Stimson and John Forster, which is assigned to the assignee of the present application and is incorporated herein by reference in its entirety), protects the vacuum chamber walls 107 from the material being deposited. However, as will be explained in greater detail below, in accordance with one aspect of the present invention, the coil-shield 104 has a helix-shaped design which permits the coil-shield 104 to function as a multi-turn coil. As a result, the amount of current necessary to couple RF energy into the plasma is reduced as compared to that required by a single turn coil. By reducing the current carrying requirements of the chamber components, the design can be simplified and costs reduced.

In the illustrated embodiment, the coil-shield 104 is made of a conductive material such as heavy duty bead blasted solid high-purity (preferably 99.995% pure) titanium formed into a generally cylindrical shape having a diameter of 10–12 inches. However, other highly conductive materials may be utilized depending upon the material being sputtered and other factors. For example, if the material to be sputtered is aluminum, both the target and the coil-shield 104 may be made of high purity aluminum.

To enable the coil-shield 104 to function as a multi-turn coil, a thin channel 122 (preferably ¼ to ⅛ inches in width) cut completely through the wall of the shield 104 is formed in a helix shape so that the resultant coil-shield 104 comprises a continuous strip of conductive material wound in a helix. Each turn or winding 123 of the coil-shield 104 is separated from the adjacent turn by a gap 125 (FIG. 3) provided by the continuous channel 122. The overall shape of the coil-shield 104 of the illustrated embodiment is generally cylindrical but other shapes may be used depending upon the application.

Figure 4:
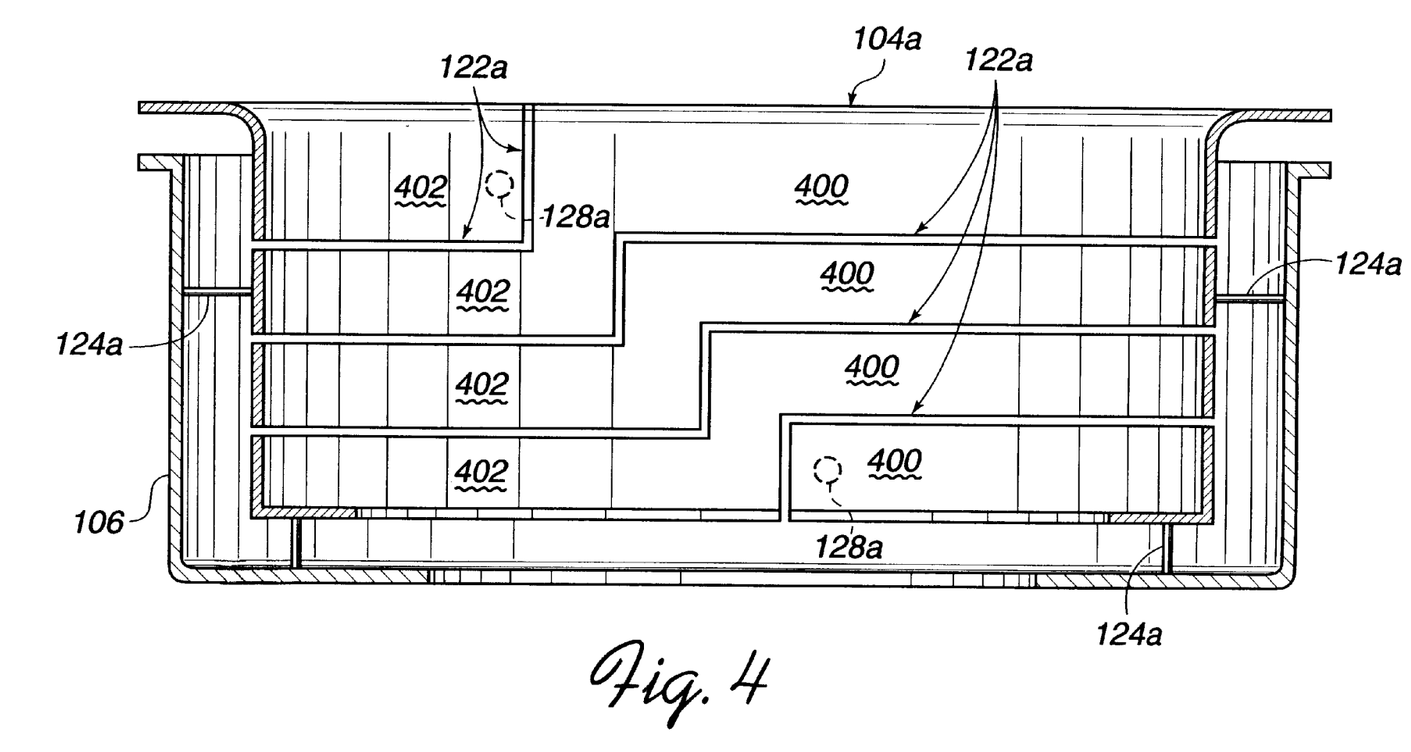
FIG. 4 is a schematic cross-sectional view of a plasma generating chamber in accordance with an alternative embodiment of the present invention.

In the illustrated embodiment, the channel 122 is cut through the shield 104 by use of a laser. Alternatively other cutting methods may be used such as EDM which uses a hot thin wire to cut metal. Although a helix shape for the channel 122 is preferred to simplify laser cutting methods, it is anticipated that the channel may be cut in other shapes including a rectilinear shape as represented by the channel 122a (FIG. 4). The channel 122a comprises straight parallel segments 400 and 402 to facilitate cutting by rotary blades and other cutting implements. In yet another embodiment, the coil-shield may be formed from a flat strip of material which is rolled into a generally cylindrical, multi-turn shape.

The channel 122 encircles the cylinder-shaped coil-shield 104 approximately three times in the illustrated embodiment to define approximately three windings or turns of the coil. It should be appreciated that the particular number of windings may vary, depending upon the particular application. Increasing the number of windings will generally reduce the necessary current levels to couple a given amount of power into the plasma but the costs of fabricating the coil-shield may be increased by cutting additional windings into the shield.

The coil-shield 104 is carried on the outer shield 106 by a plurality of coil standoffs 124 (FIG. 3) which electrically insulate the coil-shield 104 from the supporting shield 106. As set forth in greater detail in copending application Ser. No. 08/647,182, entitled Recessed Coil for Generating a Plasma, filed May 9, 1996, abandoned and assigned to the assignee of the present application, which application is incorporated herein by reference in its entirety, the insulating coil standoffs 124 have an internal labyrinth structure which permits repeated deposition of conductive materials from the target 110 onto the coil standoff 124 while preventing the formation of a complete conducting path of deposited material from the inner coil-shield 104 to the outer shield 106 which could short the coil 104 to the shield 106 (which is typically at ground).

RF power is applied to the coil 104 by feedthroughs 126 which are supported by insulating feedthrough standoffs 128. As represented in FIG. 2, the feedthroughs 126 are preferably positioned at the ends 127 of the coil-shield 104. The feedthrough standoffs 128, like the coil support standoffs 124, permit repeated deposition of conductive material from the target onto the feedthrough standoff 128 without the formation of a conducting path which could short the coil 104 to the shield 106. Thus, the coil feedthrough standoff 128 has an internal labyrinth structure somewhat similar to that of the coil standoff 124 to prevent the formation of a short between the coil 104 and the wall 140 of the outer shield 106.

Figure 3:
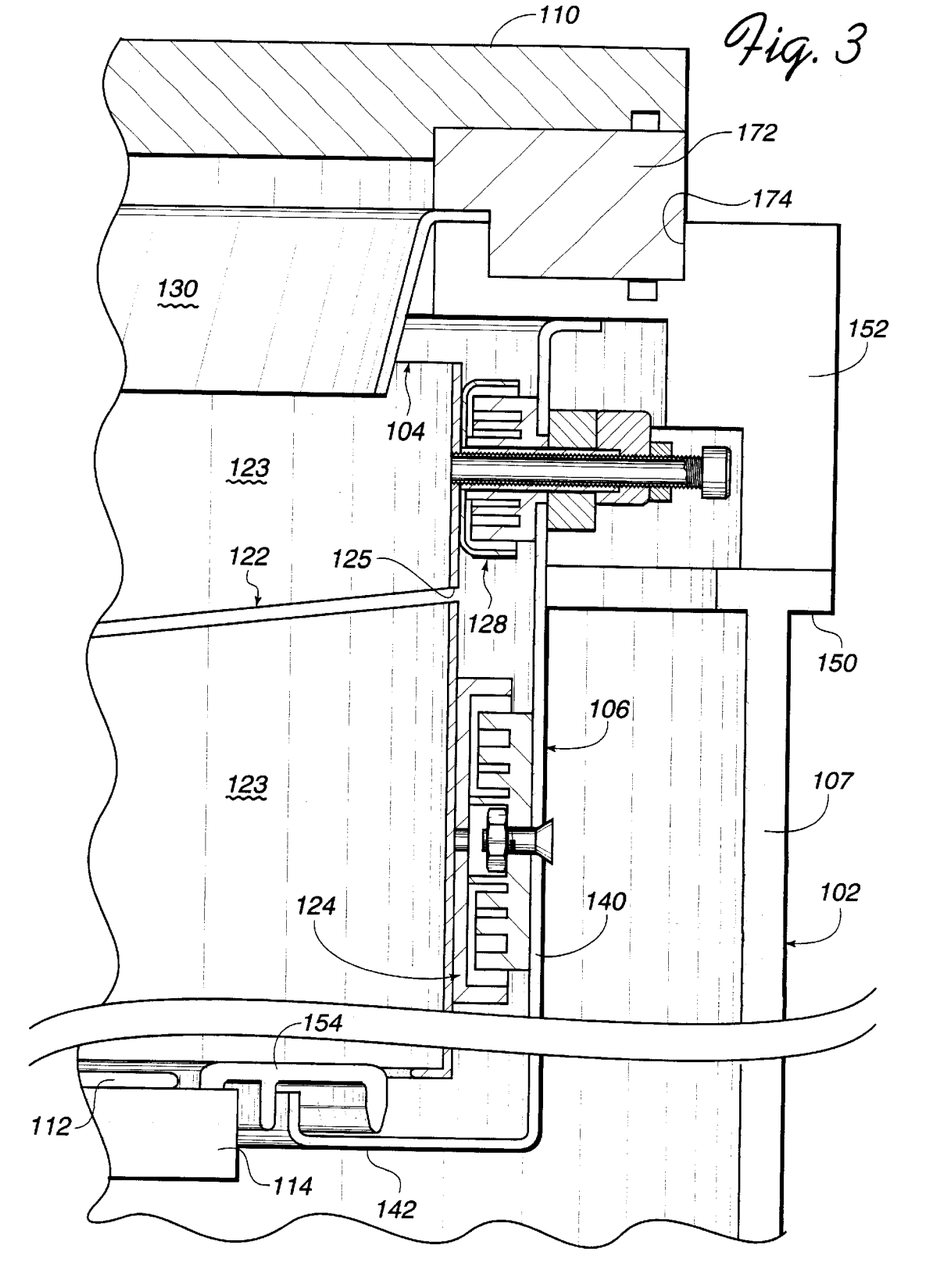
FIG. 3 is a schematic partial cross-sectional view of the plasma generating chamber of FIG. 1 shown installed in a vacuum chamber.

Another advantage of the illustrated embodiment, is that the inner coil-shield 104 protects the outer shield 106 from the material being deposited. As best seen in FIG. 3, the inner coil-shield 104 is positioned to substantially block material from reaching the outer shield 106 except for that material which passes through the channel 122 between adjacent turns of the inner coil-shield 106. Since the width of the channel 122 is relatively small as represented by the gap 125, the channel preferably occupies less than 10% of the overall interior surface area of the coil-shield 104. Thus, the coil-shield 104 encloses over 50% (preferably over 90%) of the lateral face of the plasma generation area between the target 110 and the substrate 112 and clamp 154. Consequently, only a relatively small amount of deposition material reaches the outer shield 106. Thus, conductive deposition material being deposited on the standoffs 124, 128 between the inner and outer shields can be substantially reduced. Because less material is deposited on the standoffs, it is anticipated that the design of the standoffs might be substantially simplified over the relatively complex labyrinth designs depicted in FIG. 3. For example, the labyrinth structure may have fewer channels.

FIG. 4 shows an alternative design in which the standoffs have been even further simplified. As shown therein, the coil support standoffs 124a are simple posts made of an insulative material such as ceramic. The feedthrough standoffs 128a (represented in phantom) similarly comprise a hollow ceramic post through which the RF feedthrough passes. In some applications, the amount of conductive deposition material passing through the channel 122a of the inner coil-shield 104a may be so reduced as to substantially eliminate the chance of a conductive path being deposited on the standoffs 124a or 128a which could short the inner coil-shield 104 to the outer shield 106.

In addition to reducing the amount of deposition material reaching the support and feedthrough standoffs, the inner coil-shield 104 conversely reduces or eliminates particulate deposition matter shed from the standoffs from reaching the substrate 112. Because of their relative sharp curves, the standoffs are believed to inherently shed more particulate matter than relatively flat surfaces such as the shields 104 and 106. However, because the standoffs are placed between the inner coil-shield 104 and the outer shield 106, and because the width of the channel 122 of the coil-shield 104 is small, it is believed that the coil-shield 104 substantially blocks any such particulate matter from the standoffs from reaching the interior of the plasma chamber and the substrate.

As best seen in FIGS. 1 and 3, the plasma chamber 100 has a dark space shield ring 130 which provides a ground plane with respect to the target 110 above which is negatively biased. In addition, as explained in greater detail in the aforementioned copending application Ser. No. 08/647,182, the shield ring 130 shields the outer edges of the target from the plasma to reduce sputtering of the target outer edges. The dark space shield 130 performs yet another function in that it is positioned to shield the coil-shield 104 from the material being sputtered from the target 110. The dark space shield 130 does not completely shield the coil-shield 104 from all of the material being sputtered since some of the sputtered material travels at an oblique angle with respect to the vertical axis of the plasma chamber 100. However, because much of the sputtered material does travel parallel to the vertical axis of the chamber or at relatively small oblique angles relative to the vertical axis, the dark space shield 130 which is positioned in an overlapping fashion above the coil-shield 104, prevents a substantial amount of sputtered material from being deposited on the coil-shield 104. By reducing the amount of material that would otherwise be deposited on the coil-shield 104, the generation of particles by the material which is deposited on the coil-shield 104 can be substantially reduced.

In the illustrated embodiment, the dark space shield 130 is a generally continuous ring of titanium (where titanium deposition is occurring in the chamber 100) or stainless steel having a generally inverted frusto-conical shape. The dark space shield extends inward toward the center of plasma chamber 100 so as to overlap the coil-shield 104 by a distance of ¼ inch. It is recognized, of course, that the amount of overlap can be varied depending upon the relative size and placement of the coil and other factors. For example, the overlap may be increased to increase the shielding of the coil-shield 104 from the sputtered material but increasing the overlap could also further shield the target from the plasma which may be undesirable in some applications. Also, the dark space shield ring may have a slot to reduce eddy currents induced in the ring by the overlapping coil-shield 104.

The chamber shield 106 is generally bowl-shaped (FIG. 3) and includes a generally cylindrically shaped, vertically oriented wall 140 to which the standoffs 124 and 128 are attached to insulatively support the coil-shield 104. The shield further has a generally annular-shaped floor wall 142 which surrounds the chuck or pedestal 114 which supports the workpiece 112 which has an 8" diameter in the illustrated embodiment. A clamp ring 154 may be used to clamp the wafer to the chuck 114 and cover the gap between the floor wall of the shield 106 and the chuck 114.

The plasma chamber 100 is supported by an adapter ring assembly 152 which engages the vacuum chamber. The chamber shield 106 is grounded to the system ground through the adapter ring assembly 152. The dark space shield 130, like the chamber shield 106, is grounded through the adapter ring assembly 152.

The target 110 is generally disk-shaped and is also supported by the adapter ring assembly 152. However, the target 110 is negatively biased and therefore should be insulated from the adapter ring assembly 152 which is at ground. Accordingly, seated in a circular channel formed in the underside of the target 110 is a ceramic insulation ring assembly 172 which is also seated in a corresponding channel 174 in the upper side of the adapter ring assembly 152. The insulator ring assembly 172 which may be made of a variety of insulative materials including ceramics spaces the target 110 from the adapter ring assembly 152 so that the target 110 may be adequately negatively biased. The target, adapter and ceramic ring assembly are provided with O-ring sealing surfaces (not shown) to provide a vacuum tight assembly from the vacuum chamber to the target 110.

To promote uniform erosion of the target 110, a magnetron 116 (FIG. 2) may be provided above the target 110. However, the magnetron may be omitted by increasing the RF ionization of the plasma.

In order to accommodate the coil-shield 104 to facilitate ionization of the plasma, it has been found beneficial to space the target 110 from the surface of the workpiece 112. However, this increased spacing between the target and the workpiece can adversely impact the uniformity of the material being deposited from the target. Such nonuniformity typically exhibits itself as a thickening of the deposited material toward the center of the workpiece with a consequent thinning of the deposited material toward the edges of the workpiece. As set forth in copending application Ser. No. 08/680,335, filed Jul. 10, 1996 incorporated herein by reference, this nonuniformity may be effectively compensated by sputtering deposition material not only from the sputter target 110 above the workpiece but also from a coil or other secondary target encircling the edges of the workpiece. Here, because the edges of the workpiece are closer to the coil-shield 104 than is the center of the workpiece, any material sputtered from the coil-shield 104 may tend to deposit more thickly toward the edges of the workpiece than the center. This is generally the reverse of the deposition pattern of material from the target 110. By appropriately adjusting the ratio of RF power level applied to the coil-shield 104 to the DC power level of the bias applied to the target, the deposition level of the material being sputtered from the coil-shield 104 may be selected in such a manner as to compensate substantially for the nonuniformity of the deposition profile of the material from the target such that the overall deposition profile of the layer from both sources of sputtered can be substantially more uniform than that which has often been obtained from the overhead target alone.

It is presently believed that the amount of sputtering which will originate from the coil-shield 104 as compared to the sputtering which originates from the target 110 may be a function of the RF power applied to the coil-shield 104 relative to the DC power applied to the target 110. By adjusting the ratio of the coil RF power to the target DC power, the relative amounts of material sputtered from the coil-shield 104 and the target 110 may be varied so as to achieve the desired uniformity. It is believed that a particular ratio of the coil RF power to the target DC power will achieve the smallest degree of non-uniformity of the layer of material deposited from both the coil and the target. As the RF power to the coil is increased relative to the DC power applied to the target, the deposited layer tends to be more edge thick. Conversely, by decreasing the ratio of the RF power to the coil relative to the DC power applied to the target, the center of the deposited layer tends to grow increasingly thicker relative to the edges. Thus, by adjusting the ratio of the RF power to the coil relative to the DC power biasing the target, the material being sputtered from the coil can be increased or decreased as appropriate to effectively compensate for non-uniformity of the material being deposited from the target to achieve a more uniform deposited layer comprising material from both the target and the coil. For the multi-turn coil-shield 104, a coil RF power to target DC power ratio of approximately 0.7 may provide satisfactory results on an 8 inch diameter wafer.

It is further believed that the relative amounts of sputtering between the coil and the target may also be a function of the DC biasing of the coil-shield 104 relative to that of the target 110. This DC biasing of the coil-shield 104 may be adjusted in a variety of methods. For example, the matching network 302 typically includes inductors and capacitors. By varying the capacitance of one or more capacitors of the matching network, the DC biasing of the coil-shield 104 might be adjusted to achieve the desired level of uniformity. In one embodiment, the RF power to the coil and the DC biasing of the coil-shield 104 may have separate adjustment inputs to achieve the desired results. An alternative power arrangement could include two RF generators operated at slightly different frequencies. The output of one generator would be coupled to the coil in the conventional manner but the other generator at the slightly different frequency would be capacitively coupled to the coil such that a change in the power level of the second generator would change the DC bias of the coil. Such an arrangement could provide independent control of the RF power and DC bias applied to the coil. At present, it is believed that relatively large changes in DC bias to the coil for a given RF power level would be necessary to have a substantial effect on the amount of material sputtered from the coil.

Each of the embodiments discussed above utilized a single coil in the plasma chamber. It should be recognized that the present invention is applicable to plasma chambers having more than one RF powered coil. For example, the present invention may be applied to multiple coil chambers for launching helicon waves of the type described in copending application Ser. No. 08/559,345.

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil-shield 104 is preferably 2 MHz but it is anticipated that the range can vary from, for example, 1 MHz to 100 MHz. An RF power setting of 4.5 kW is preferred but a range of 1.5–5 kW is believed to be satisfactory. In some applications, energy may also be transferred to the plasma by applying AC or DC power to coils and other energy transfer members. A DC power setting for biasing the target 110 of 3 kW is preferred but a range of 2–5 kW and a pedestal bias voltage of −30 volts DC is believed to be satisfactory for many applications.

In the illustrated embodiment, the shield 106 has a diameter of 13½" but it is anticipated that good results can be obtained so long as the shield has a diameter sufficient to extend beyond the outer diameter of the target, the substrate support and substrate, to shield the chamber from the plasma. The shield 106 may be fabricated from a variety of materials including insulative materials such as ceramics or quartz. However, the shield and all metal surfaces likely to be coated with the target material are preferably made of the same material as the sputtered target material but may be made of a material such as stainless steel or copper. The material of the structure which will be coated should have a coefficient of thermal expansion which closely matches that of the material being sputtered to reduce flaking of sputtered material from the shield or other structure onto the wafer. In addition, the material to be coated should have good adhesion to the sputtered material. Thus for example if the deposited material is titanium, the preferred metal of the shields, brackets and other structures likely to be coated is bead blasted titanium. Any surfaces which are likely to sputter would preferably be made of the same type of material as the target such as high purity titanium, for example. Of course, if the material to be deposited is a material other than titanium, the preferred metal is the deposited material, stainless steel or copper. Adherence can also be improved by coating the structures with molybdenum prior to sputtering the target. However, it is preferred that the coil (or any other surface likely to sputter) not be coated with molybdenum or other materials since the molybdenum can contaminate the workpiece if sputtered from the coil.

The wafer to target space is preferably about 140 mm but can range from about 1.5" to 8". For this wafer to target spacing, a coil diameter of about 11½ inches is preferred. Increasing the diameter of the coil which moves the coil away from the workpiece edge can have an adverse effect on bottom coverage. On the other hand, decreasing the coil diameter to move the coil closer to the wafer edge can adversely affect layer uniformity. It is believed that decreasing the coil diameter will cause the coil to be more closely aligned with the target resulting in substantial deposition of material from the target onto the coil which in turn can adversely affect the uniformity of material being sputtered from the coil.

As set forth above, the relative amounts of material sputtered from the target 110 and the coil-shield 104 are a function of the ratio of the RF power applied to the coil and the DC power applied to the target. However, it is recognized that in some applications, an RF power level which is optimum for improving the uniformity of the deposited layer of materials from the coil and the target may not be optimum for generating a plasma density for ionization. An alternative embodiment of a plasma chamber may have a second target which, although generally shaped like a coil, is not coupled to an RF generator. Instead, the second target may be formed of a flat closed ring coupled through feedthrough standoffs to a variable negative DC bias source. As a consequence, the chamber may have three "targets," the first target 110, the second ring target, and the RF coil-shield 104.

A variety of precursor gases may be utilized to generate the plasma including Ar, $H_2$ or reactive gases such as $NF_3$, $CF_4$ and many others. Various precursor gas pressures are suitable including pressures of 0.1–50 mTorr. For ionized PVD, a pressure between 10 and 100 mTorr is preferred for best ionization of sputtered material.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for coupling energy from a source into a plasma, the apparatus comprising:
   a target;
   a substrate holder;
   a plasma generation area between said target and said substrate holder;
   a conductive first shield wall defining a channel so that said first shield wall further defines a plurality of spaced coil windings wherein said channel occupies less than 10% of the surface area of said conductive first shield wall, said conductive first shield coil windings being coupled to said source to radiate energy from said conductive first shield coil windings into said plasma generation area.

2. The apparatus of claim 1 wherein said channel is less than ¼ inch in width so that said conductive first shield windings are spaced less than ¼ inch apart.

3. The apparatus of claim 1 wherein said conductive first shield wall is generally cylindrical in shape.

4. The apparatus of claim 3 wherein said conductive first shield wall channel encircles said conductive first shield wall a plurality of times to define said conductive first shield wall windings.

5. The apparatus of claim 4 wherein said conductive first shield wall channel is helix-shaped.

6. The apparatus of claim 1 wherein said plasma generation area has a lateral face and said first shield wall has a surface area sufficient to enclose at least 50% of said plasma generation area lateral face.

7. The apparatus of claim 1 further comprising a second shield wall positioned outside said conductive first shield wall.

8. The apparatus of claim 7 further comprising insulating standoffs between said first and second shield walls.

9. The apparatus of claim 1 wherein said source comprises an RF generator and said conductive first shield coil windings are coupled to said RF generator to inductively couple RF energy from said conductive first shield coil windings into said plasma of said plasma generation area.

10. An apparatus for coupling electromagnetic energy from an RF source into a plasma, the apparatus comprising:
    a chamber having a chamber wall;
    a conductive first shield wall positioned within the chamber to protect at least a portion of the chamber wall from deposition materials, wherein said shield wall comprises a continuous strip of conductive material which forms a multi-turn coil having two ends, one end of which is coupled to said RF source and the other end is coupled to ground and wherein said first shield wall further comprises a channel separating each turn of said first conductive shield wall multi-turn coil, said channel occupying less than 10% of the surface area of said conductive first shield wall.

11. The apparatus of claim 10 further comprising a second shield wall positioned between said conductive first shield wall and said chamber wall to protect at least a portion of the chamber wall from deposition materials.

12. The apparatus of claim 11 further comprising insulating standoffs between said first and second shield walls.

13. The apparatus of claim 10 wherein said channel is less than ¼ inch in width so that said conductive first shield turns are spaced less than ¼ inch apart.

14. The apparatus of claim 10 wherein said conductive first shield wall is generally cylindrical in shape.

15. The apparatus of claim 14 wherein said channel encircles said conductive first shield wall a plurality of times to define said conductive first shield wall turns.

16. The apparatus of claim 15 wherein said conductive first shield wall channel is helix-shaped.

17. The apparatus of claim 10 wherein said plasma generation area has a lateral face and said first shield wall has a surface area sufficient to enclose at least 50% of said plasma generation area lateral face.

18. A method of forming an RF antenna for a plasma deposition chamber, comprising:
    cutting a channel into a shield wall of conductive material so that said shield wall forms a multi-turn coil wherein said channel occupies less than 10% of the surface area of said conductive shield wall;
    installing said shield wall between a target and a substrate holder; and
    coupling a source of RF energy to said shield wall.

19. The method of claim 18 wherein said cutting is performed using a laser.

20. The method of claim 18 wherein said cutting is performed using a hot wire.

21. The method of claim 18 wherein said conductive first shield wall is generally cylindrical in shape.

22. The method of claim 21 wherein said channel encircles said conductive first shield wall a plurality of times to define said conductive first shield wall turns of said coil.

23. The method of claim 18 wherein said channel is cut into a helix shape.

24. The method of claim 18 wherein said channel is less than ¼ inch wide.

25. The method of claim 18 further comprising blocking deposition material using a second shield wall positioned behind said first shield wall.

26. A method of sputter depositing a deposition material onto a substrate, comprising:
    coupling RF energy into a plasma from a first conductive shield wall formed into a coil having a plurality of windings wherein said conductive first shield wall has a channel which encircles said conductive first shield wall a plurality of times to define said conductive first shield wall windings of said coil and wherein said channel occupies less than 10% of the surface area of said conductive first shield wall; and
    ionizing deposition material passing through said plasma.

27. The method of claim 26 wherein said conductive first shield wall is generally cylindrical in shape.

28. The method of claim 27 wherein said channel is cut into a helix shape.

29. The method of claim 27 wherein said channel is less than ¼ inch wide.

30. The method of claim 26 further comprising blocking deposition material using a second shield wall positioned behind said first shield wall.

31. The method of claim 30 further wherein insulating standoffs are positioned between said first and second shield walls.

32. The method of claim 26 wherein said coupling includes inductively coupling RF current through said coil windings to said plasma.

33. The method of claim 26 wherein said plasma is maintained in a plasma generation area which has a lateral face and said first shield wall has a surface area sufficient to enclose at least 50% of said plasma generation area lateral face.

34. An apparatus for use with an RF generator to sputter deposit ionized material onto a substrate, the apparatus comprising:

a vacuum chamber having a chamber wall;

a sputter target disposed in said chamber and comprising said sputter deposition material;

a substrate holder disposed in said chamber for holding said substrate;

a plasma generation area positioned within said chamber between said target and said substrate holder; and a cylindrical conductive shield wall positioned within said chamber and encircling said plasma generation area to protect at least a portion of said chamber wall from deposition materials, wherein said shield wall has a channel which defines a strip of conductive material which forms a multi-turn coil having two ends, said channel separating each turn of said conductive shield wall multi-turn coil wherein said channel encircles said conductive first shield wall a plurality of times to define a plurality of said conductive shield wall turns, said channel occupying less than 10% of the surface area of said conductive shield wall, and wherein said one end of said multi-turn coil is coupled to said RF generator and the other end is coupled to ground so that said multi-turn coil of said shield wall inductively couples RF energy from said generator to said plasma.

35. A method of sputter depositing ionized deposition material onto a substrate in a vacuum chamber, comprising:

inductively coupling RF energy from an RF generator into a plasma in a plasma generation area from a cylindrical conductive shield wall positioned within the chamber and encircling said plasma generation area to protect at least a portion of a chamber wall from deposition materials, wherein said shield wall has a channel which defines a strip of conductive material which forms a multi-turn coil having two ends, said channel separating each turn of said conductive shield wall multi-turn coil wherein said channel encircles said conductive first shield wall a plurality of times to define a plurality of said conductive shield wall turns, said channel occupying less than 10% of the surface area of said conductive shield wall, and wherein said one end of said multi-turn coil is coupled to said RF generator and the other end is coupled to ground so that said multi-turn coil of said shield wall inductively couples RF energy from said generator to said plasma; and ionizing deposition material passing through said plasma; and depositing ionized deposition material onto a substrate.

* * * * *